(12) United States Patent
Baek

(10) Patent No.: US 12,320,827 B2
(45) Date of Patent: Jun. 3, 2025

(54) TEST SOCKET AND METHOD OF FABRICATING THE SAME

(71) Applicant: LEENO INDUSTRIAL INC., Busan (KR)

(72) Inventor: Seungha Baek, Busan (KR)

(73) Assignee: LEENO INDUSTRIAL INC., Busan (KR)

( * ) Notice: Subject to any disclaimer, the term of this patent is extended or adjusted under 35 U.S.C. 154(b) by 349 days.

(21) Appl. No.: 17/769,791

(22) PCT Filed: Jun. 22, 2021

(86) PCT No.: PCT/KR2021/007802
§ 371 (c)(1),
(2) Date: Apr. 18, 2022

(87) PCT Pub. No.: WO2022/005085
PCT Pub. Date: Jan. 6, 2022

(65) Prior Publication Data
US 2022/0357361 A1    Nov. 10, 2022

(30) Foreign Application Priority Data
Jun. 30, 2020   (KR) .................. 10-2020-0079763

(51) Int. Cl.
*G01R 1/04*   (2006.01)
*G01R 3/00*   (2006.01)

(52) U.S. Cl.
CPC ............ *G01R 1/0441* (2013.01); *G01R 3/00* (2013.01)

(58) Field of Classification Search
CPC ......... G01R 1/0433–0483; G01R 1/06–07392; G01R 3/00

USPC .............. 324/754.01, 754.03, 754.6–754.14, 324/754.18, 755.01–756.7, 762.01–762.06
See application file for complete search history.

(56) References Cited

U.S. PATENT DOCUMENTS

| | | | |
|---|---|---|---|
| 7,420,383 B2 * | 9/2008 | Yoshida | G01R 1/045 324/756.07 |
| 7,663,387 B2 * | 2/2010 | Yoshida | G01R 1/06772 324/756.02 |
| 2007/0111560 A1 | 5/2007 | Kazama et al. | |

(Continued)

FOREIGN PATENT DOCUMENTS

| JP | 2003-302441 A | 10/2003 |
|---|---|---|
| JP | 2005-156530 A | 6/2005 |

(Continued)

OTHER PUBLICATIONS

Korean Office Action of Korean Application No. 10-2020-0079763 dated Aug. 13, 2021.

(Continued)

*Primary Examiner* — Eman A Alkafawi
*Assistant Examiner* — Rahul Maini
(74) *Attorney, Agent, or Firm* — Sughrue Mion, PLLC

(57) ABSTRACT

A test socket includes a socket block of an insulating material, provided with a probe hole to accommodate the probe, and a coating portion comprising an external film of a conductive material coated on an outer surface of the socket block, and an internal film of a conductive material coated on an inner surface of the probe hole, at least a portion of the internal film being electrically isolated from the external film.

6 Claims, 11 Drawing Sheets

(56) References Cited

U.S. PATENT DOCUMENTS

| | | | |
|---|---|---|---|
| 2007/0145991 | A1 | 6/2007 | Yoshida |
| 2008/0139017 | A1* | 6/2008 | Kiyofuji ............ G01R 1/07371 439/75 |
| 2013/0065455 | A1 | 3/2013 | Kawata et al. |
| 2015/0233973 | A1 | 8/2015 | Wooden et al. |
| 2020/0141975 | A1* | 5/2020 | Hironaka ............... G01R 1/045 |

FOREIGN PATENT DOCUMENTS

| | | |
|---|---|---|
| JP | 2005-351731 A | 12/2005 |
| JP | 2007-178164 A | 7/2007 |
| JP | 2009-085948 A | 4/2009 |
| JP | 2010-175371 A | 8/2010 |
| JP | 4607004 B2 | 1/2011 |
| JP | 2011-252766 A | 12/2011 |
| KR | 10-2014-0003743 A | 1/2014 |
| KR | 10-1534778 B1 | 7/2015 |
| KR | 10-2017-0030783 A | 3/2017 |
| KR | 10-2017-0095449 A | 8/2017 |
| KR | 10-2017-0110346 A | 10/2017 |
| KR | 10-2018-0118294 A | 10/2018 |
| KR | 10-2019-0017427 A | 2/2019 |
| KR | 10-2044753 B1 | 11/2019 |
| TW | 201839407 A | 11/2018 |
| TW | 202022388 A | 6/2020 |

OTHER PUBLICATIONS

Korean Notice of Allowance of Korean Application No. 10-2020-0079763 dated Dec. 6, 2021.
Taiwanese Office Action of Taiwanese Application No. 110120622 dated Nov. 8, 2021.
International Search Report of PCT/KR2021/007802 dated Oct. 14, 2021.
Written Opinion of PCT/KR2021/007802 dated Oct. 14, 2021.
Notification of Reasons for Refusal dated Feb. 28, 2023 from the Japanese Patent Office in Application No. 2022-519729.

* cited by examiner

【FIG. 1】
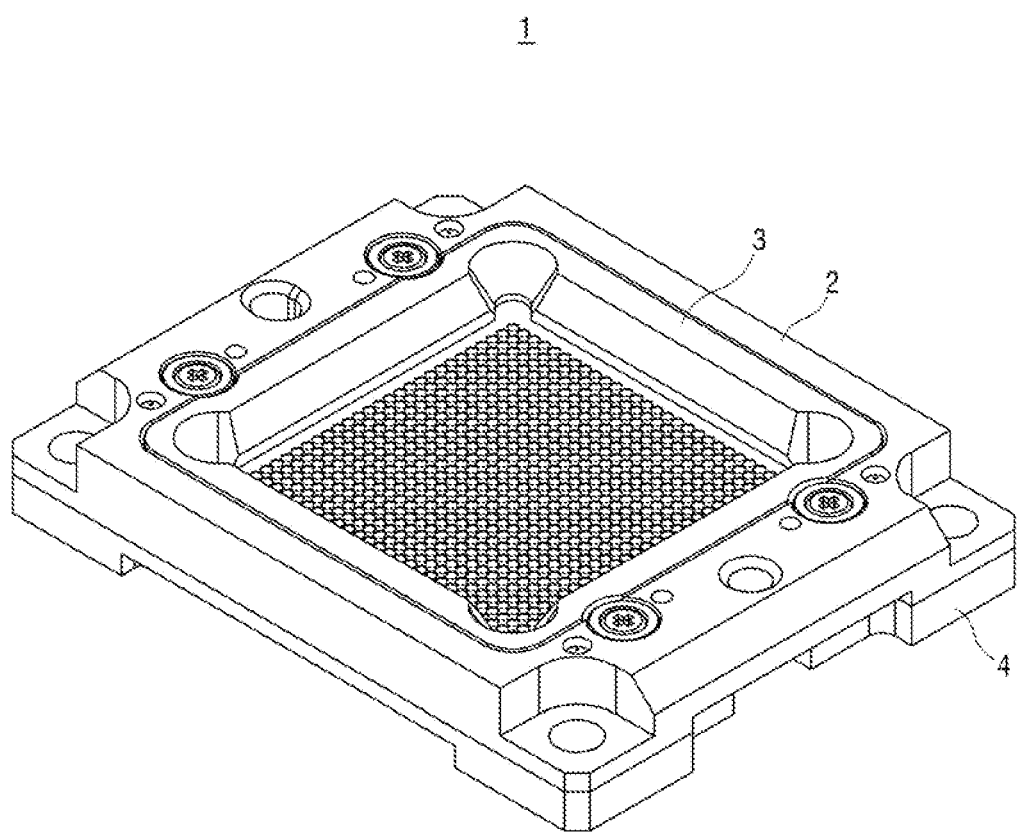

[FIG. 2]
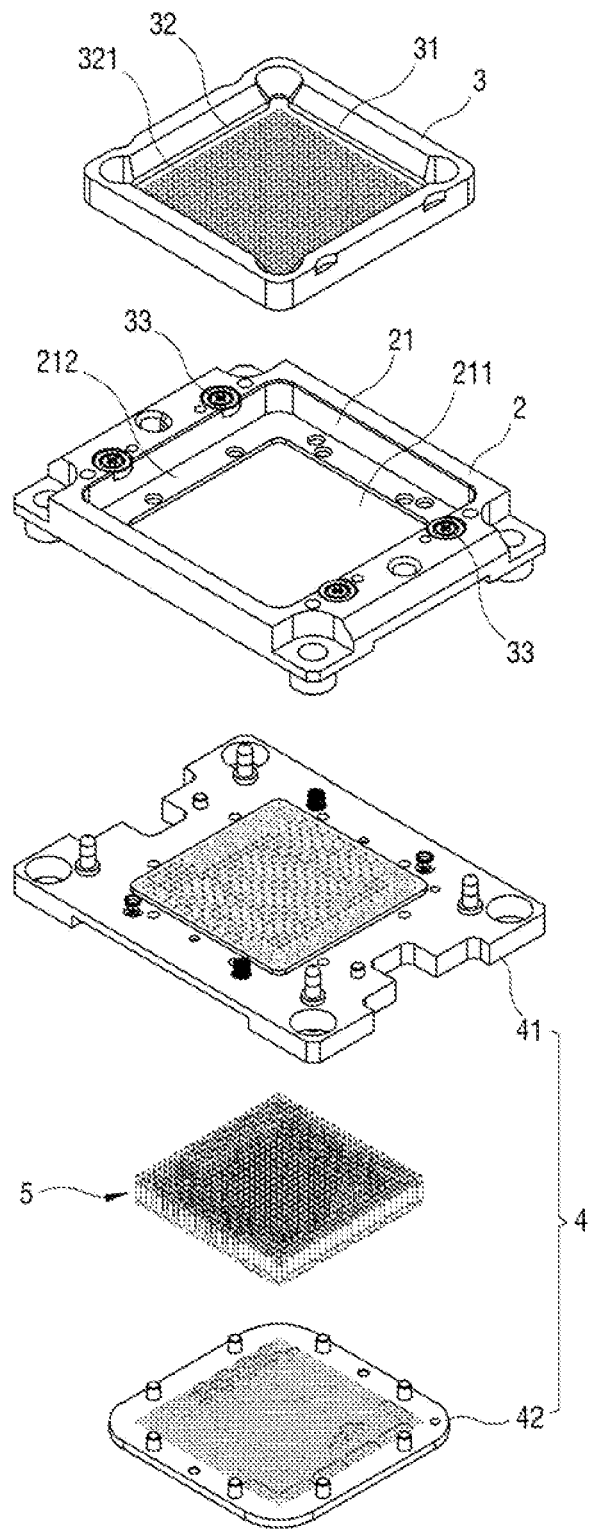

【FIG. 3】
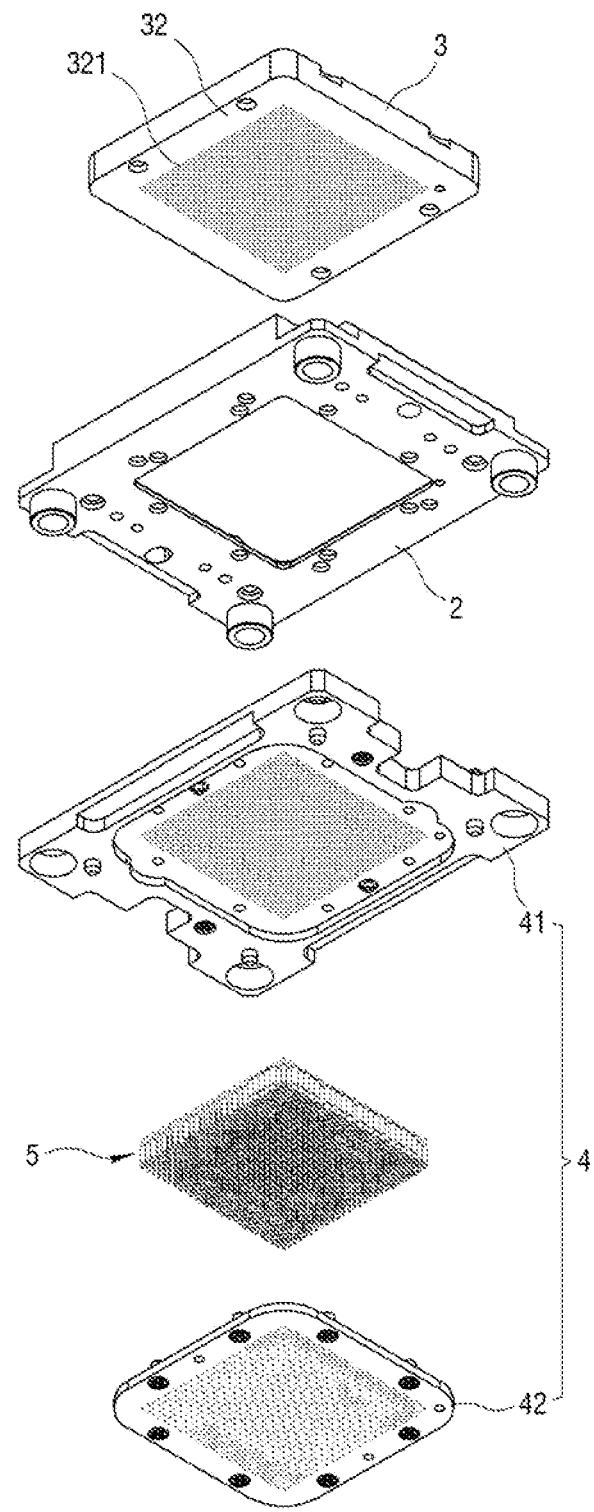

[FIG. 4]
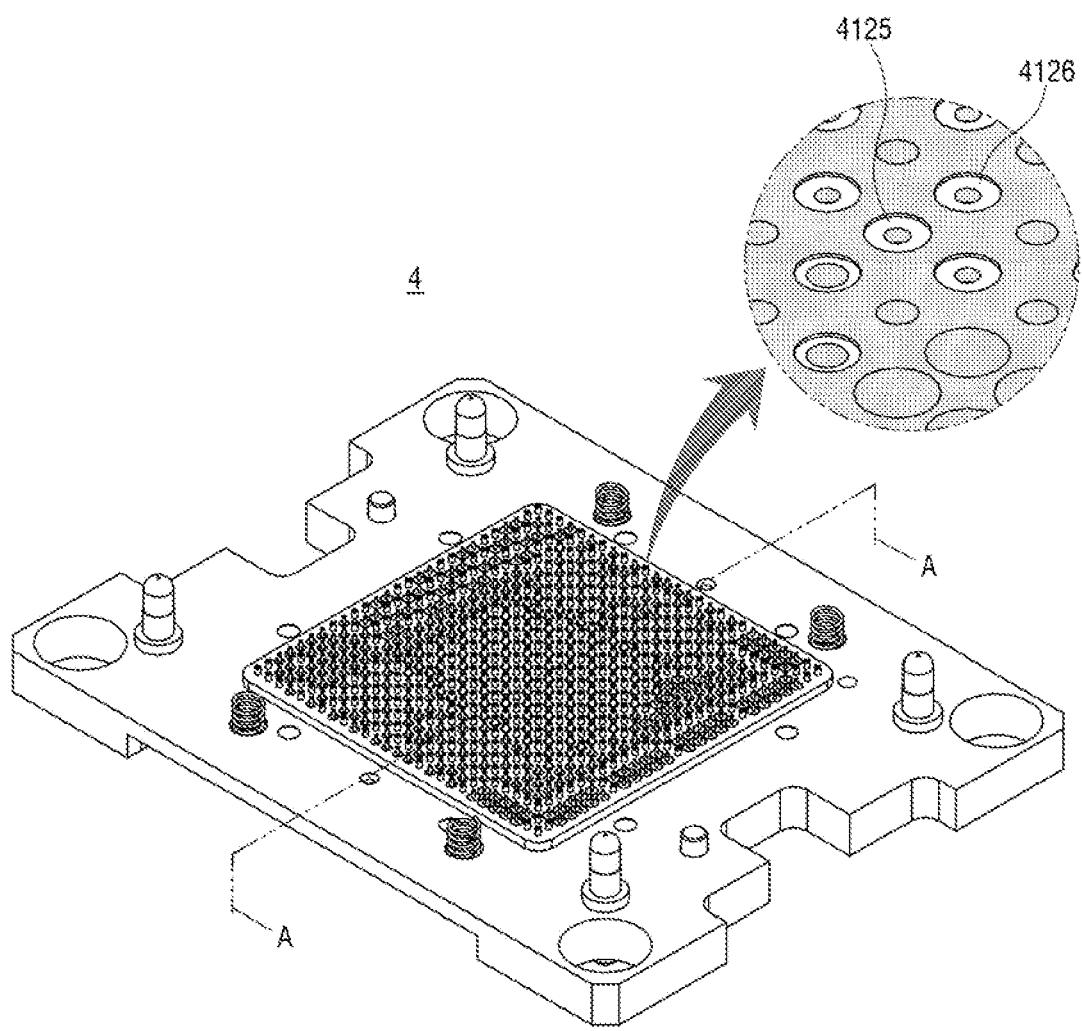

[FIG. 5]
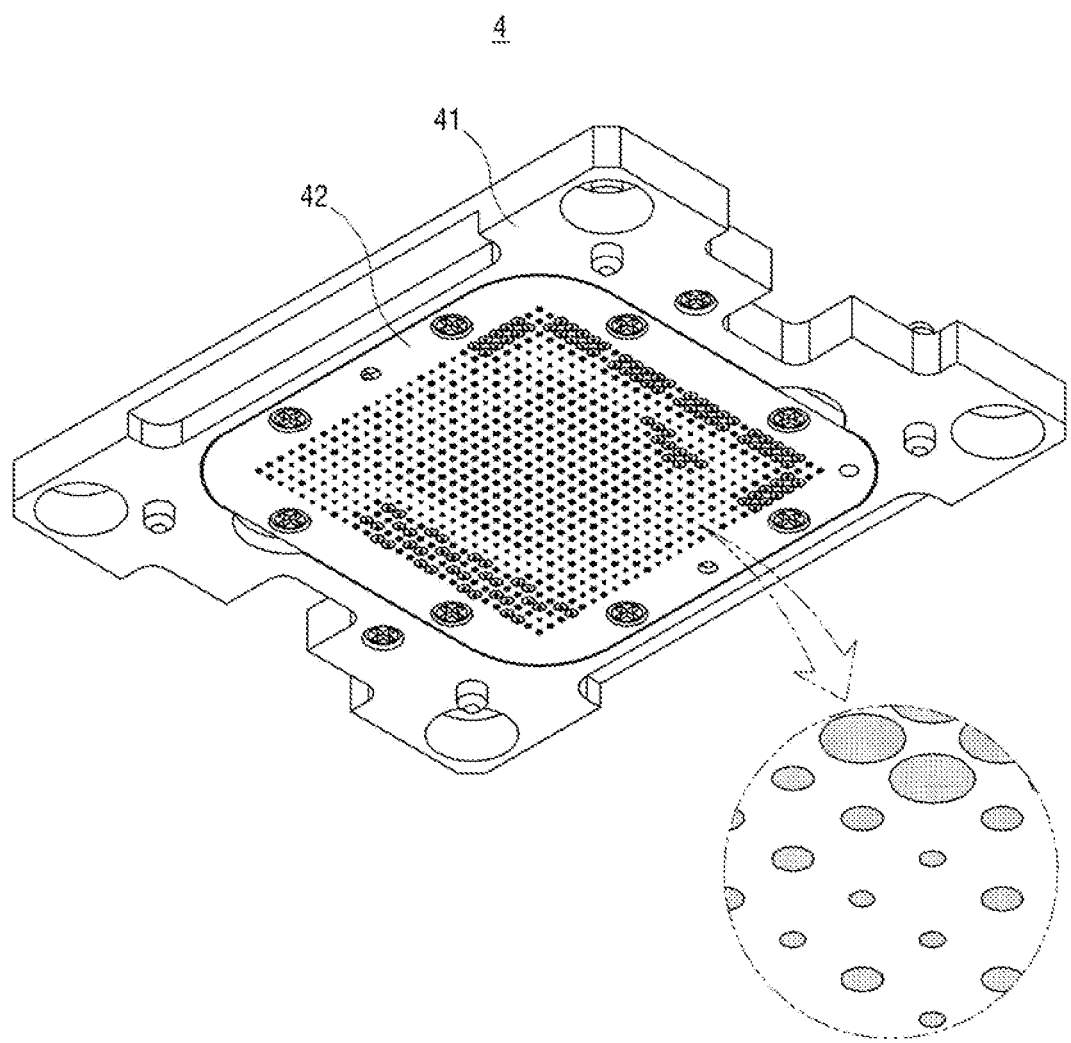

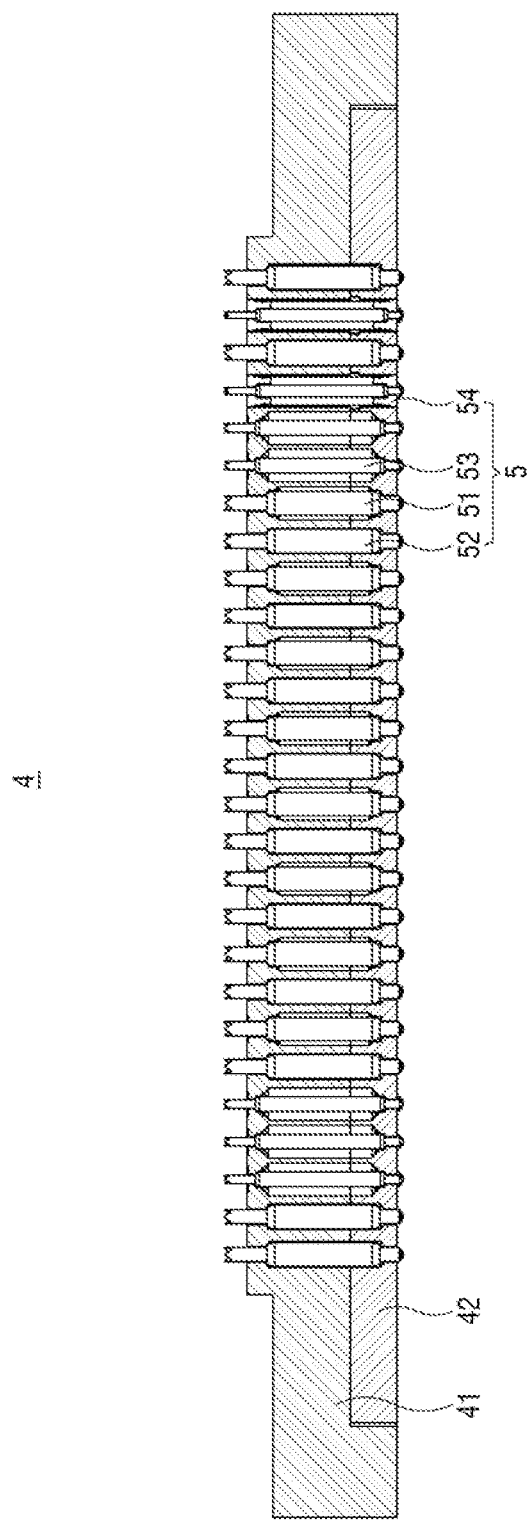
[FIG. 6]

[FIG. 7]
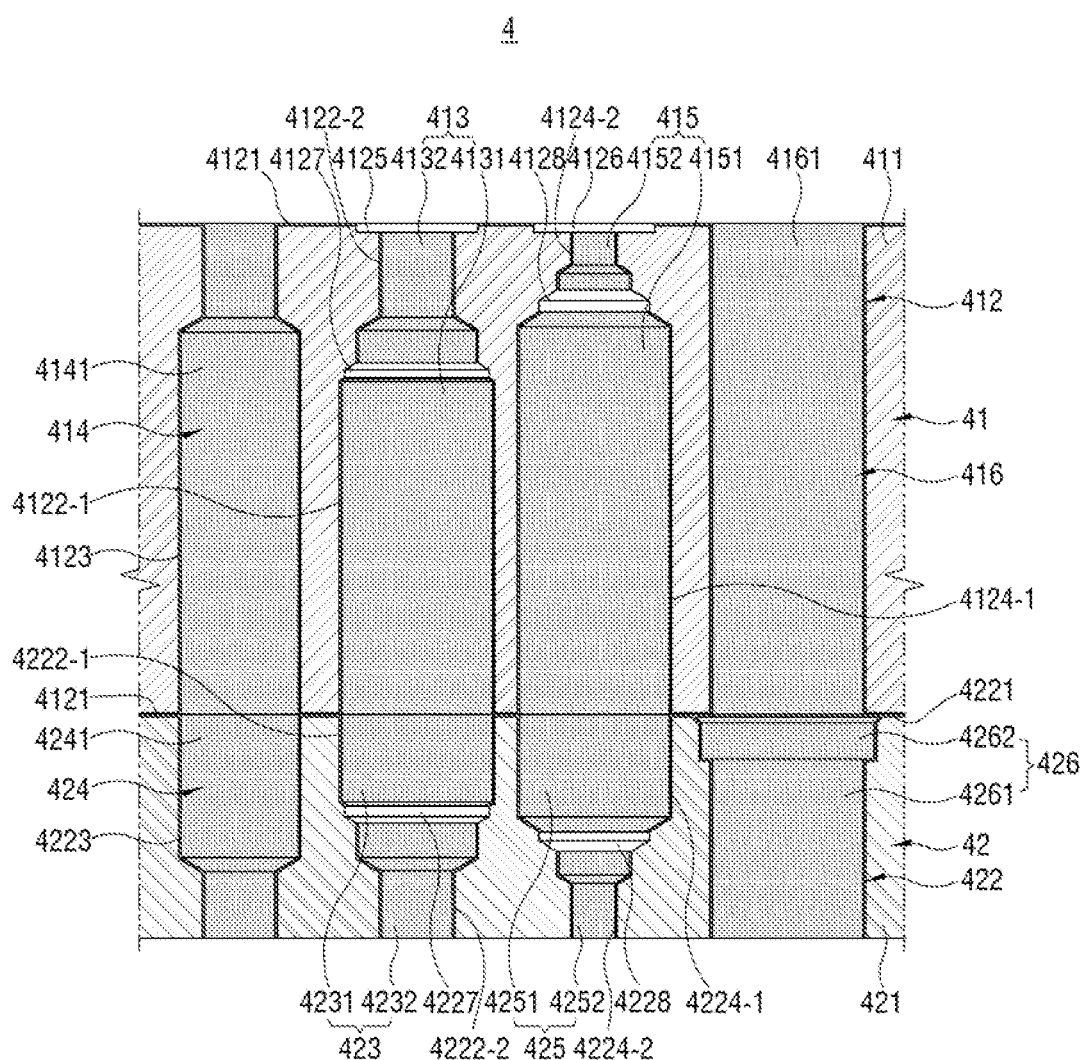

[FIG. 8]
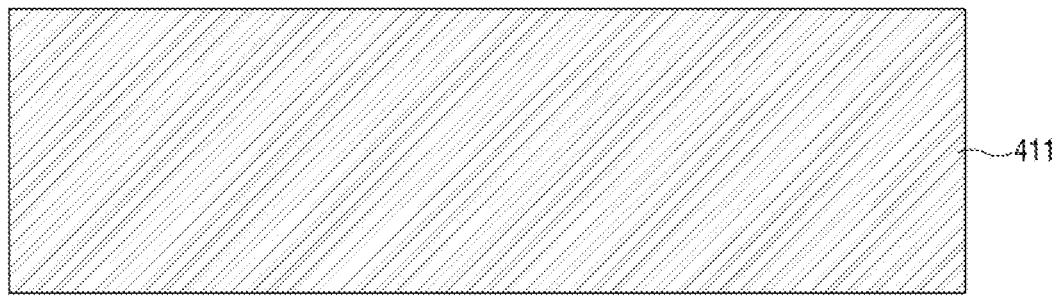
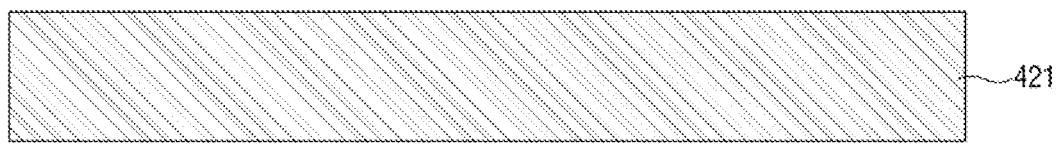

[FIG. 9]
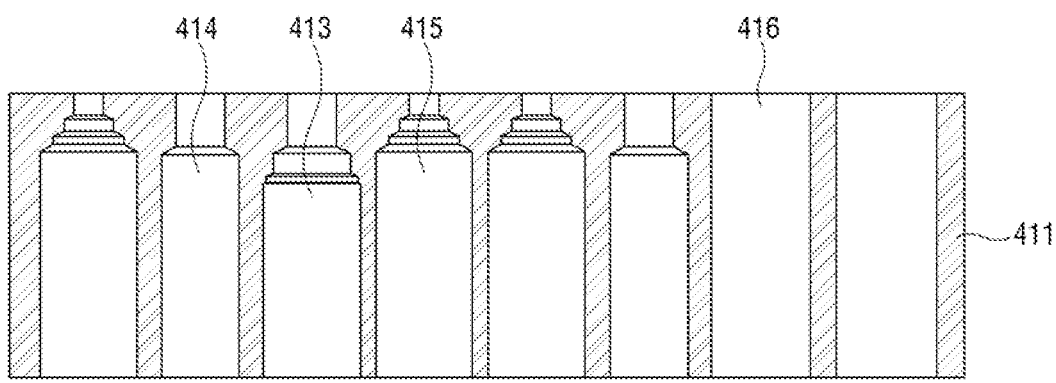
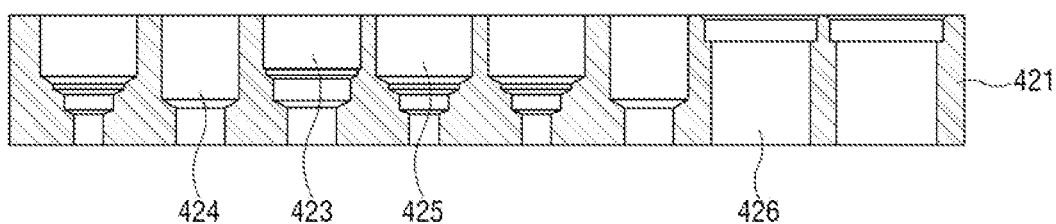

[FIG. 10]
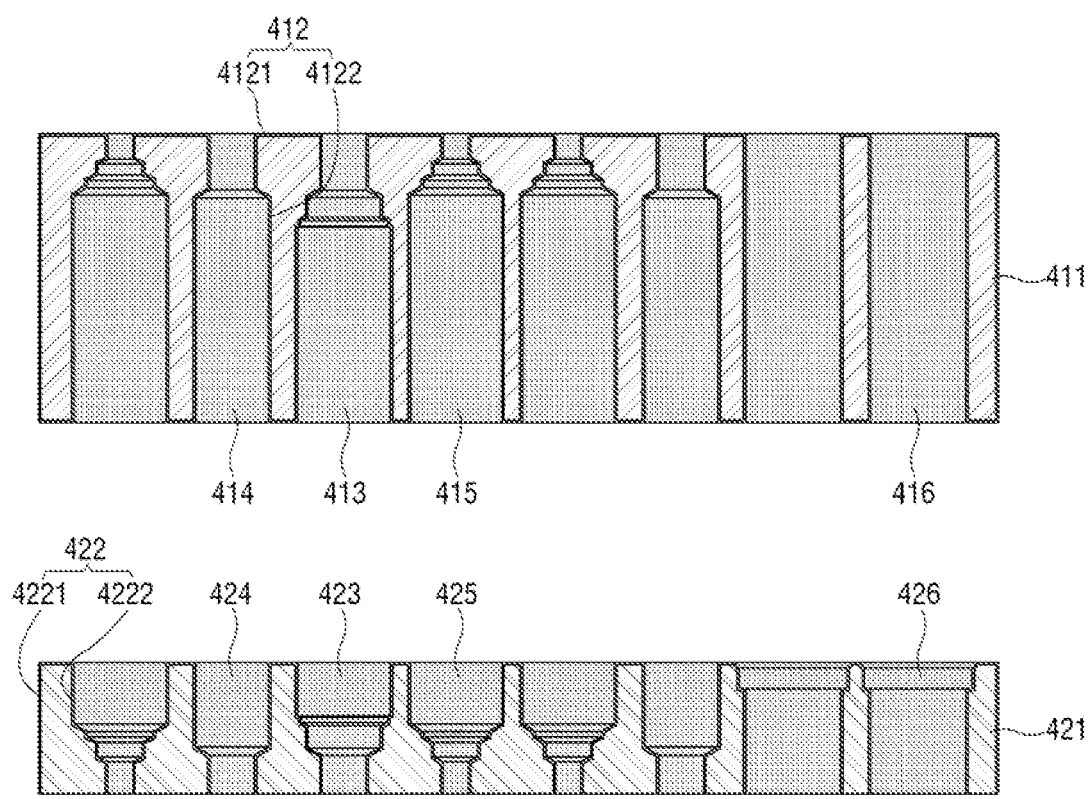

[FIG. 11]
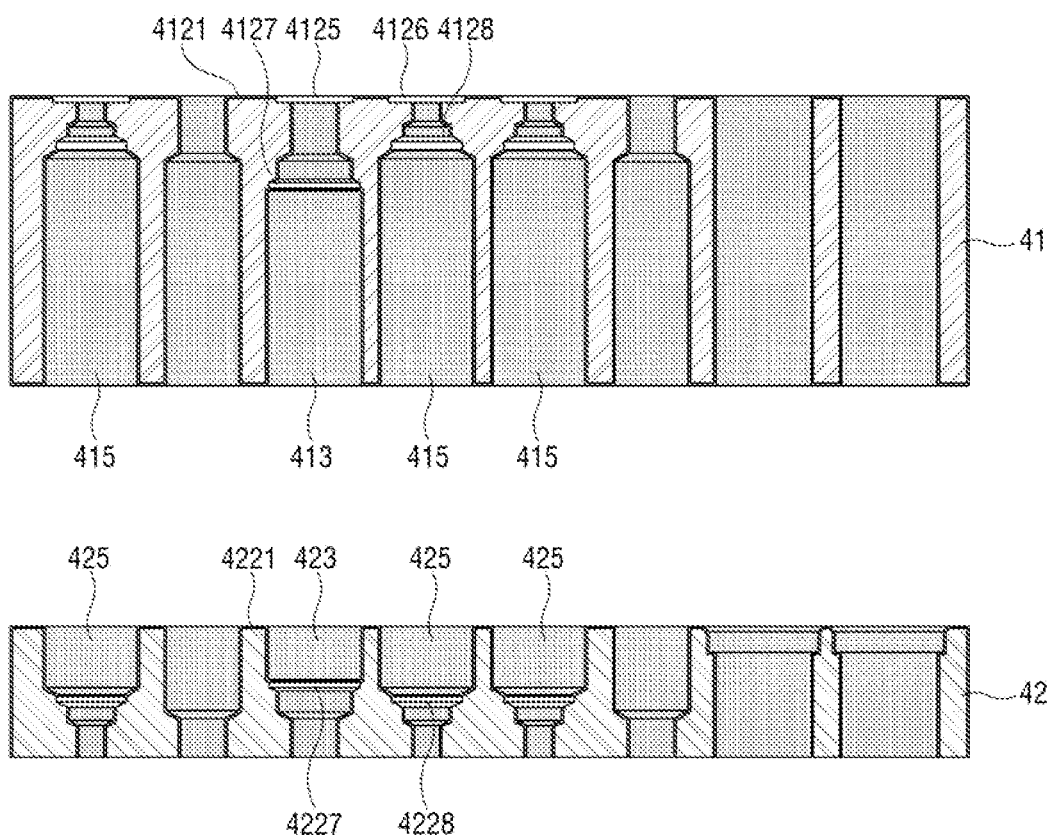

TEST SOCKET AND METHOD OF FABRICATING THE SAME

TECHNICAL FIELD

The disclosure relates to a test socket for testing electric characteristics of a semiconductor or the like object-to-be-tested, and a method of fabricating the same.

BACKGROUND ART

A test device for testing a high-frequency or high-speed semiconductor includes a probe for a high frequency.

In the test device for testing the high-frequency or high-speed semiconductor, signal probes are mounted to a conductive block without contact to prevent interference between adjacent signal probes. In this case, the signal probe passes through a probe hole of the conductive block so as not to be in contact with an inner wall of the probe hole, and then the opposite end portions of the signal probe are supported on a pair of insulating plates provided on both sides of the conductive block. Such a conventional test device additionally needs the pair of insulating plates coupled to the conductive block, and thus complicates a structure, thereby increasing fabrication costs. Further, an alignment error between the probe accommodating hole of the conductive block and one pair of probe supporting holes respectively formed in one pair of insulating plates to support both ends of the signal probe and a machining error in the probe accommodating hole and the probe supporting hole may worsen an insertion loss characteristic, a return loss characteristic, a crosstalk characteristic, an isolation characteristic, a Z-impedance characteristic or an inductance characteristic.

DISCLOSURE

Technical Problem

An aspect of the disclosure is to provide a test socket, of which a structure is simple to reduce fabrication costs, and a method of fabricating the same.

Another aspect of the disclosure is to provide a test socket, which is improved in an insertion loss characteristic, a return loss characteristic, a crosstalk characteristic, an isolation characteristic, a Z-impedance characteristic or an inductance characteristic, and a method of fabricating the same.

Technical Solution

According to an embodiment of the disclosure, a test socket supporting a probe is provided. The test socket includes a socket block of an insulating material, provided with a probe hole to accommodate the probe, and a coating portion comprising an external film of a conductive material coated on an outer surface of the socket block, and an internal film of a conductive material coated on an inner surface of the probe hole, at least a portion of the internal film being electrically isolated from the external film.

The probe hole may include an accommodating portion to accommodate the probe and first and second supporting portions to respectively support opposite end portions of the probe, and the at least a portion of the internal film comprises a portion to cover the first and second supporting portions.

The probe may include a power probe to apply power, and a signal probe to apply a test signal.

According to an embodiment of the disclosure, a method of fabricating a test socket supporting a probe is provided. The method includes preparing a socket block of an insulating material, forming a probe hole, in which the probe is inserted, in the socket block, forming a coating portion comprising an external film and an internal film by coating an outer surface of the socket block and an inner surface of the probe hole with a conductive material and electrically isolating at least a portion of the internal film from the external film.

The at least a portion of the internal film may include portions to which opposite end portions of the probe are supported.

The probe hole may include an accommodating portion having a larger diameter than the probe, and first and second supporting portions to respectively support the opposite end portions of the probe, and the isolating comprises removing an external film surrounding opposite outlets of the probe hole, a boundary portion between a first end of the accommodating portion and the first supporting portion, and a boundary portion between a second end of the accommodating portion and the second supporting portion.

Advantageous Effects

In the test socket of the present invention, a socket block made of an insulating material having a probe hole for supporting a power or signal probe is entirely covered with a conductive film, and then a coating portion of a supporting portion supporting the power or signal probe is electrically isolated. As a result, the test socket has a simple structure so that the power or signal probe is surrounded by the grounded environment, and the gap between the ground walls surrounding the power or signal probe is made constant, so that insertion loss characteristics, return loss characteristics, and crosstalk characteristics, isolation characteristics, Z-Impedance characteristics, and inductance characteristics can be improved.

DESCRIPTION OF DRAWINGS

FIG. 1 is a perspective view of a test socket according to a first embodiment of the disclosure;

FIG. 2 is an exploded perspective view of the test socket of FIG. 1, viewed from above;

FIG. 3 is an exploded perspective view of the test socket of FIG. 1, viewed from below;

FIG. 4 is a perspective view of a socket block, viewed from above;

FIG. 5 is a perspective view of a socket block, viewed from below;

FIG. 6 illustrates a partial cross-section taken along line A-A of FIG. 4;

FIG. 7 is a partial enlarged view of a socket block excluding a probe;

FIGS. 8 to 11 illustrate a method of fabricating a socket block according to an embodiment of the disclosure.

BEST MODE

Below, embodiments of the disclosure will be described in detail with reference to accompanying drawings.

FIG. 1 is a perspective view of a test socket 1 according to a first embodiment of the disclosure, FIG. 2 is an exploded perspective view of the test socket 1 of FIG. 1, viewed from above, and FIG. 3 is an exploded perspective view of the test socket 1 of FIG. 1, viewed from below.

Referring to FIGS. 1 to 3, the test socket 1 includes a base frame 2, an insert 3 accommodating an object-to-be-tested and accommodated in the base frame 2, and a socket block 4.

The base frame 2 includes an insert accommodating portion 21 that accommodates the insert 3 at the center thereof. The insert accommodating portion 21 may include a quadrangular opening 211 formed at the center thereof, and a support 212 formed at the bottom edges of the opening 211.

The insert 3 maybe accommodated in the insert accommodating portion 21 of the base frame 2 while being spaced apart from the support 212 of the insert accommodating portion 21 by a spring (not shown). The insert 3 includes an object-to-be-tested accommodating portion 31 to accommodate an object-to-be-tested, and a bottom portion 32 provided on the bottom of the object-to-be-tested accommodating portion 31. The bottom portion 32 includes a plurality of terminal accommodating holes 321 in which terminals, e.g., bumps of an object-to-be-tested are settled. The bottom portion 32 may be positioned corresponding to the opening 211 of the insert accommodating portion 21.

The insert 3 may be restricted by four bolts 33 not to be pulled out in the state of being accommodated in the insert accommodating portion 21. In result, the insert 3 may move down while pressing the spring (not shown) when an object-to-be-tested accommodated in the object-to-be-tested accommodating portion 31 is pressed at a test.

The socket block 4 includes an upper block 41, and a lower block 42. The socket block 4 may include a plurality of probes 5.

FIG. 4 is a perspective view of a socket block, viewed from above, FIG. 5 is a perspective view of a socket block, viewed from below, and FIG. 6 illustrates a partial cross-section taken along line A-A of FIG. 4.

Referring to FIGS. 4 to 6, the socket block 4 includes the upper block 41, the lower block 42 and the plurality of probes 5, which are coupled to one another. The probe 5 is elastically retractable in a lengthwise direction at the test. The probe 5 may include a power probe 51 to which voltage is applied, a ground probe 52 to which a ground signal is applied, a signal probe 53 to which a test signal is applied, and/or an coaxial probe 54. The power probe 51, the ground probe 52, the signal probe 53 and the coaxial probe 54 may have outer surfaces made of a conductive material. The coaxial probe 54 maybe omitted, replaced by the signal probe 53, or used instead of the signal probe 53.

FIG. 7 is a partial enlarged view of the socket block 4 excluding the probe 5.

Referring to FIG. 7, the upper block 41 includes a first block main body 411 of an insulating material, for example, engineering plastic or ceramic, and a first coating portion 412 formed by entirely applying a conductive material to the first block main body 411.

The first block main body 411 includes a first power-probe hole 413, a first ground-probe hole 414, a first signal-probe hole 415 and a first coaxial probe hole 416 to respectively accommodate and support the upper end portions of the power probe 51, the ground probe 52, the signal probe 53 and the coaxial probe 54 as shown in FIG. 6.

The first power-probe hole 413 may include a first power-probe accommodating hole 4131 to accommodate an upper portion of the power probe 51 without contact, and a first power-probe supporting hole 4132 to support an upper end portion of the power probe 51 with contact.

The first ground-probe hole 414 may include a first ground-probe accommodating hole 4141 to accommodate an upper portion of the ground probe 52 with contact.

The first signal-probe hole 415 may include a first signal-probe accommodating hole 4151 to accommodate an upper portion of the signal probe 53 without contact, and a first signal-probe supporting hole 4152 to support an upper end portion of the signal probe 53 with contact.

The first coaxial probe hole 416 may include a first coaxial-probe accommodating hole 4161 to accommodate an upper portion of the coaxial probe 54.

The first coating portion 412 may include a first external film 4121 formed by plating the outer surface of the first block main body 411 with a conductive material, for example, gold (Au), and first and second power-hole internal films 4122-1 and 4122-2, a first ground-hole internal film 4123, and first and second signal-hole internal films 4124-1 and 4124-2 respectively formed by plating the inner surfaces of the first power-probe hole 413, the first ground-probe hole 414 and the first signal-probe hole 415 with the conductive material, e.g. gold (Au).

The first coating portion 412 may include a first upper-surface isolator 4125 to electrically isolate the first external film 4121 coated on the upper surface of the first block main body 411 from the second power-hole internal film 4122-2 coated in the first power-probe supporting hole 4132.

The first coating portion 412 may include a second upper-surface isolator 4126 to electrically isolate the first external film 4121 coated on the upper surface of the first block main body 411 from the second signal-hole internal film 4124-2 coated in the first signal-probe supporting hole 4152.

The first coating portion 412 may include a first inner-surface isolator 4127 to electrically isolate the first power-hole internal film 4122-1 coated in the first power-probe accommodating hole 4131 from the second power-hole internal film 4122-2 coated in the first power-probe supporting hole 4132.

The first coating portion 412 may include a second inner-surface isolator 4128 to electrically isolate the first signal-hole internal film 4124-1 coated in the first signal-probe accommodating hole 4151 from the second signal-hole internal film 4124-2 coated in the first signal-probe supporting hole 4152.

As described above, the first external film 4121 may be kept grounded through the ground probe 52 and the first ground-hole internal film 4123. Further, the first power-hole internal film 4122-1 and the first signal-hole internal film 4124-1 respectively coated on the first power-probe accommodating hole 4131 and the first signal-probe accommodating hole 4151 may be electrically connected to the first external film 4121 coated on the lower surface of the first block main body 411, and thus kept grounded.

On the other hand, the second power-hole internal film 4122-2 coated on the first power-probe supporting hole 4132 may be electrically isolated from the first external film 4121 by the first upper-surface isolator 4 125 and the first inner-surface isolator 4127. The second signal-hole internal film 4124-2 coated on the first signal-probe supporting hole 4152 may be electrically isolated from the first external film 4121 by the second upper-surface isolator 4126 and the second inner-surface isolator 4128.

The lower block 42 includes a second block main body 421 of an insulating material, for example, ceramic, and a second coating portion 422 formed by entirely applying a conductive material to the second block main body 421. The second coating portion 422 may not be formed on a lower surface of the second block main body 421 to be in contact with a test circuit board (not shown), or the film may be entirely removed from the lower surface. When the lower surface of the second block main body 421 is disposed not to be in contact with the test circuit board, first and second lower-surface isolators maybe formed like the first and second upper-surface isolators 4125 and 4126 of the upper block 41.

The lower block 42 includes a second power-probe hole 423, a second ground-probe hole 424, a second signal-probe hole 425 and a second coaxial probe hole 426 to respectively accommodate and support the lower end portions of the power probe 51, the ground probe 52, the signal probe 53 and the coaxial probe 54 of FIG. 6.

The second power-probe hole 423 may include a second power-probe accommodating hole 4231 to accommodate a lower portion of the power probe 51 without contact, and a second power-probe supporting hole 4232 to support a lower end portion of the power probe 51 with contact.

The second ground-probe hole 424 may include a second ground-probe accommodating hole 4241 to accommodate a lower portion of the ground probe 52 with contact.

The second signal-probe hole 425 may include a second signal-probe accommodating hole 4251 to accommodate a lower portion of the signal probe 53 without contact, and a second signal-probe supporting hole 4252 to support a lower end portion of the signal probe 53 with contact.

The second coaxial probe hole 426 may include a second coaxial-probe accommodating hole 4261 to accommodate an upper portion of the coaxial probe 54, and a flange hole 4262 to accommodate a flange 5411 of the coaxial probe 54.

The second coating portion 422 may include a second external film 4221 formed by plating the outer surface of the second block main body 422 with a conductive material, for example, gold (Au), and third and fourth power-hole internal films 4222-1 and 4222-2, a second ground-hole internal film 4223, and third and fourth signal-hole internal films 4224-1 and 4224-2 respectively formed by plating the inner surfaces of the second power-probe hole 423, the second ground-probe hole 424 and the second signal-probe hole 425 with the conductive material, e.g. gold (Au).

The second coating portion 422 may include a third inner-surface isolator 4227 to electrically isolate a third power-hole internal film 4222-1 coated on the second power-probe accommodating hole 4231 from a fourth power-hole internal film 4222-2 coated on the second power-probe supporting hole 4232.

The second coating portion 422 may include a fourth inner-surface isolator 4228 to electrically isolate a third signal-hole internal film 4224-1 coated on the second signal-probe accommodating hole 4251 from a fourth signal-hole internal film 4224-2 coated on the second signal-probe supporting hole 4252.

As described above, the second external film 4221 may be kept grounded through the ground probe 52 and the second ground-hole internal film 4223. Further, the third power-hole internal film 4222-1 and the third signal-hole internal film 4224-1 respectively coated on the second power-probe accommodating hole 4231 and the second signal-probe accommodating hole 4251 may be electrically connected to the second external film 4221 coated on the upper surface of the second block main body 421, and thus kept grounded.

On the other hand, the fourth power-hole internal film 4222-2 coated on the second power-probe supporting hole 4232 maybe electrically isolated from the second external film 4221 by the third inner-surface isolator 4227. The fourth signal-hole internal film 4224-2 coated on the second signal-probe supporting hole 4252 may be electrically isolated from the second external film 4221 by the fourth inner-surface isolator 4228.

The first external film 4121 and the second external film 4221 may be in contact with each other and wholly kept grounded when the upper block 41 and the lower block 42 are coupled.

FIGS. 8 to 11 illustrate a method of fabricating the socket block 4 according to an embodiment of the disclosure.

As shown in FIG. 8, the first block main body 411 and the second block main body 421 made of the insulating material, for example, the ceramic.

As shown in FIG. 9, the first power-probe hole 413, the first ground-probe hole 414, the first signal-probe hole 415 and the first coaxial probe hole 416 are drilled in the first block main body 411, and the second power-probe hole 423, the second ground-probe hole 424, the second signal-probe hole 425 and the second coaxial probe hole 426 are drilled in the second block main body 421.

As shown in FIG. 10, the first and second block main bodies 411 and 421 are generally plated with the conductive material, for example, gold to form the first coating portion 412 and the second coating portion 422.

The first coating portion 412 may include the first external film 4121 covering the outer surface of the first block main body 411, and the first internal film 4122 covering the first power-probe hole 413, the first ground-probe hole 414, the first signal-probe hole 415 and the first coaxial probe hole 416.

The second coating portion 422 may include the second external film 4221 covering the outer surface of the second block main body 421, and the second internal film 4222 covering the second power-probe hole 423, the second ground-probe hole 424, the second signal-probe hole 425 and the second coaxial probe hole 426.

As shown in FIG. 11, the first external film 4121 surrounding the top outlets of the first power-probe hole 413 and the first signal-probe hole 415 maybe partially removed to form the first and second upper-surface isolators 4125 and 4126. Further, portions of the inner surfaces of the first power-probe hole 413 and the first signal-probe hole 415, to which the upper end portions of the power probe 51 and the signal probe 53 are supported, or their lower portions may be partially removed to form the first and second inner-surface isolators 4127 and 4128. In result, the upper end portions of the power probe 51 and the signal probe 53 may be supported to be electrically isolated by the first upper-surface isolator 4125 and the first inner-surface isolator 4127 and by the second upper-surface isolator 4126 and the second inner-surface isolator 4128.

Likewise, portions of the inner surfaces of the second power-probe hole 423 and the second signal-probe hole 425, to which the lower end portions of the power probe 51 and the signal probe 53 are supported, or their upper portions maybe partially removed to form the third and fourth inner-surface isolators 4227 and 4228. In this case, when the second block main body 421 has a plated lower surface, the lower surface maybe entirely removed or only a portion surrounding the bottom outlets of the second power-probe hole 423 and the second signal-probe hole 425 may be removed. In result, the upper end portions of the power probe 51 and the signal probe 53 may be supported to be electrically isolated by the third and fourth inner-surface isolators 4227 and 4228. Last, as shown in FIG. 6, the first block main body 411 and the second block main body 421 may be coupled in the state that the power probe 51, the ground probe 52, the signal probe 53 and the coaxial probe 54 are inserted therebetween, thereby completing the socket block 4.

In the foregoing description, merits of the disclosure have been described with reference to specific embodiments. However, it will be obvious to a person having ordinary skill in the art that various modifications and changes can be made without departing from the scope of the disclosure defined in appended claims. Therefore, the descriptions and drawings need to be construed as an example of the disclosure rather than limitations of the disclosure. All such possible modifications should be made within the scope of the disclosure.

The invention claimed is:

1. A test socket supporting a probe, comprising:
   a socket block of an insulating material, provided with a probe hole to accommodate the probe; and
   a coating portion comprising an external film of a conductive material coated on an outer surface of the socket block, and an internal film of a conductive material coated on an inner surface of the probe hole,
   wherein at least a portion of the internal film is electrically isolated from the external film at a portion of the inner surface of the probe hole.

2. The test socket according to claim 1, wherein
   the probe hole comprises an accommodating portion to accommodate the probe and first and second supporting portions to respectively support opposite end portions of the probe, and
   the at least a portion of the internal film comprises a portion to cover the first and second supporting portions.

3. The test socket according to claim 1, wherein the probe comprises a power probe to apply power, and a signal probe to apply a test signal.

4. A method of fabricating a test socket supporting a probe, the method comprising:
   preparing a socket block of an insulating material;
   forming a probe hole, in which the probe is inserted, in the socket block;
   forming a coating portion comprising an external film and an internal film by coating an outer surface of the socket block and an inner surface of the probe hole with a conductive material; and
   electrically isolating at least a portion of the internal film from the external film by removing a portion of the internal film at the inner surface of the probe hole.

5. The method according to claim 4, wherein the at least a portion of the internal film comprises portions to which opposite end portions of the probe are supported.

6. The method according to claim 4, wherein
   the probe hole comprises an accommodating portion having a larger diameter than the probe, and first and second supporting portions to respectively support the opposite end portions of the probe, and
   the isolating comprises removing an external film surrounding opposite outlets of the probe hole, a boundary portion between a first end of the accommodating portion and the first supporting portion, and a boundary portion between a second end of the accommodating portion and the second supporting portion.

* * * * *